(12) United States Patent
Hardy et al.

(10) Patent No.: US 7,782,058 B2
(45) Date of Patent: Aug. 24, 2010

(54) SYSTEM AND METHOD FOR ACCELERATED MR IMAGING

(75) Inventors: Christopher Judson Hardy, Niskayuna, NY (US); Luca Marinelli, Schenectady, NY (US)

(73) Assignee: General Electric Company, Niskayuna, NY (US)

( * ) Notice: Subject to any disclaimer, the term of this patent is extended or adjusted under 35 U.S.C. 154(b) by 127 days.

(21) Appl. No.: 12/110,446

(22) Filed: Apr. 28, 2008

(65) Prior Publication Data

US 2009/0267602 A1 Oct. 29, 2009

(51) Int. Cl.
G01V 3/00 (2006.01)

(52) U.S. Cl. ...................... 324/318; 324/309

(58) Field of Classification Search ......... 324/300–322; 600/407–445
See application file for complete search history.

(56) References Cited

U.S. PATENT DOCUMENTS

| | | | | |
|---|---|---|---|---|
| 5,313,163 | A * | 5/1994 | Hardy et al. | 324/309 |
| 5,957,843 | A * | 9/1999 | Luk Pat et al. | 600/410 |
| 6,141,578 | A | 10/2000 | Hardy | |
| 6,841,998 | B1 * | 1/2005 | Griswold | 324/309 |
| 6,946,839 | B2 * | 9/2005 | Porter | 324/309 |
| 7,075,302 | B2 * | 7/2006 | Zhu | 324/318 |
| 7,254,435 | B2 * | 8/2007 | Zhang et al. | 600/410 |
| 7,352,181 | B2 * | 4/2008 | Vittorio | 324/309 |
| 7,403,002 | B2 * | 7/2008 | Feiweier | 324/307 |
| 2004/0257078 | A1 | 12/2004 | Porter | |
| 2007/0055137 | A1 | 3/2007 | Feiweier | |
| 2008/0012562 | A1 * | 1/2008 | Beatty | 324/307 |
| 2008/0310695 | A1 * | 12/2008 | Garnier et al. | 382/131 |

OTHER PUBLICATIONS

Hardy et al., "Rapid M-mode MRI Using Under-sampled 2D Excitation and Parallel Imaging," International Society for Magnetic Resonance in Medicine 15th Meeting, May 19-25, 2007, Berlin, p. 359.

Ehman et al., Adaptive Technique for High-Definition MR Imaging of Moving Structures:, Radiology, vol. 173, No. 1, pp. 255-263, Oct. 1989.

Grissom, "RF Pulse Design for Parallel Excitation in MRI", University of Michigan dissertation, pp. 1-131, Nov. 24, 2007.

Hardy et al., "Rapid M-mode MRI Undersampled 2D Excitation and Parallel Reconstruction"m International Scoiety for Magnetic Resonance in Medicine 15th Meeting, p. 359, May 19-25, 2007.

* cited by examiner

*Primary Examiner*—Brij B Shrivastav
(74) *Attorney, Agent, or Firm*—Scott J. Asmus

(57) ABSTRACT

A system and method for accelerated MR imaging includes a magnetic resonance imaging (MRI) system having a plurality of gradient coils positioned about a bore of a magnet, and an RF transceiver system and an RF switch controlled by a pulse module to transmit RF signals to an RF coil assembly comprising at least one RF transmit coil and comprising multiple coils to acquire MR images. The MRI apparatus also has a computer programmed to excite multiple pencil regions by use of an under-sampled echo-planar excitation trajectory and acquire MR signals simultaneously on multiple channels of the RF coil assembly. The computer is also programmed to separate contributions from the various multiple pencil regions by use of parallel imaging reconstruction.

18 Claims, 4 Drawing Sheets

SYSTEM AND METHOD FOR ACCELERATED MR IMAGING

BACKGROUND OF THE INVENTION

The present invention relates to MRI (Magnetic Resonance Imaging) methods and apparatus. More specifically, the invention relates to methods of shortening 2D (two-dimensional) excitation pulses for MRI and MRI apparatus using the same.

When a substance such as human tissue is subjected to a uniform magnetic field (polarizing field $B_0$), the individual magnetic moments of the spins in the tissue attempt to align with this polarizing field, but precess about it in random order at their characteristic Larmor frequency. If the substance, or tissue, is subjected to a magnetic field (excitation field $B_1$) which is in the x-y plane and which is near the Larmor frequency, the net aligned moment, or "longitudinal magnetization", $M_z$, may be rotated, or "tipped", into the x-y plane to produce a net transverse magnetic moment $M_t$. A signal is emitted by the excited spins after the excitation signal $B_1$ is terminated and this signal may be received and processed to form an image.

When utilizing these signals to produce images, magnetic field gradients ($G_x$, $G_y$, and $G_z$) are employed. Typically, the region to be imaged is scanned by a sequence of measurement cycles in which these gradients vary according to the particular localization method being used. The resulting set of received NMR signals are digitized and processed to reconstruct the image using one of many well known reconstruction techniques.

In general, MRI methods involve pulse sequences that include RF (radio-frequency) pulses and magnetic-field-gradient pulses. M-mode (or "motion" mode) MR is a technique useful for real-time monitoring of the motion of organs such as the diaphragm and heart. M-mode MRI uses 2D excitation pulses to excite a cylindrical or "pencil" region in place of the usual slice excitation, followed by a readout gradient along the pencil axis to produce real-time scrolling 1D images, e.g., of cardiac wall and valve motion.

Insertion of velocity encoding pulses before the readout gradient yields a method for imaging blood flow, e.g., in the heart and major vessels. An ECG-gated (Electrocardiograph-gated) Fourier-velocity-encoding variant of this produces detailed movies of blood velocity distributions over the cardiac cycle, analogous to Doppler M-mode ultrasound. In one non-velocity-encoded application called respiratory navigation, the excited pencil is aligned in the head-foot direction intersecting the diaphragm, and the resulting signal is used to monitor diaphragm position in real time to correct for respiratory motion during imaging. One major problem with the abovementioned techniques is that the time resolution is limited by the extensive duration of the 2D excitation pulses.

The time resolution limited by the extensive duration of the 2D excitation pulses can be remedied in principle with the use of a parallel excitation architecture—multiple transmit elements driven by independent drivers.

However, the parallel excitation approach requires extensive setup and there are currently only a few scanners capable of this. Therefore, there exists a need for reducing the duration of 2D excitation pulses in M-mode MRI without the use of parallel excitation.

BRIEF DESCRIPTION OF THE INVENTION

The present invention provides a system and method of accelerated MR imaging that overcome the aforementioned drawbacks.

In accordance with an aspect of the invention, an MRI apparatus includes a magnetic resonance imaging (MRI) system having a plurality of gradient coils positioned about a bore of a magnet, and an RF transceiver system and an RF switch controlled by a pulse module to transmit RF signals to an RF coil assembly comprising at least one RF transmit coil and comprising multiple coils to acquire MR images. The MRI apparatus also has a computer programmed to excite multiple pencil regions by use of an under-sampled echo-planar excitation trajectory and acquire MR signals simultaneously on multiple channels of the multi-channel RF coil assembly. The computer is also programmed to separate contributions from the various multiple pencil regions by use of parallel imaging reconstruction.

In accordance with another aspect of the invention, a method of producing an MR M-mode image of an object with an MRI apparatus includes executing an under-sampled echo-planar excitation trajectory to excite multiple columns of the object and acquiring MR signals simultaneously on multiple channels from an RF receiver array comprising multiple coils, each coil coupled to a respective channel. The method includes reconstructing an image from the acquired MR signals by separating contributions from the multiple columns by use of parallel imaging reconstruction.

In accordance with yet another aspect of the invention, an MRI apparatus includes a pulse generator configured to generate multiple pencil excitation regions in an imaging subject by use of an under-sampled echo-planar excitation trajectory and an image processor. The image processor is configured to simultaneously acquire MR signals on multiple channels, the MR signals acquired from the multiple pencil excitation regions excited via the under-sampled echo-planar excitation trajectory. The image processor is also configured to separate contributions from the multiple pencil excitation regions on the simultaneously acquired MR signals by use of parallel imaging reconstruction.

Various other features and advantages of the present invention will be made apparent from the following detailed description and the drawings.

BRIEF DESCRIPTION OF THE DRAWINGS

The drawings illustrate embodiments presently contemplated for carrying out the invention.

In the drawings.

DETAILED DESCRIPTION OF THE PREFERRED EMBODIMENT

In the following, reference is made to embodiments of the invention. However, it should be understood that the invention is not limited to specific described embodiments. Instead, any combination of the following features and elements, whether related to different embodiments or not, is contemplated to implement and practice the invention. Furthermore, in various embodiments the invention provides numerous advantages over the prior art. However, although embodiments of the invention may achieve advantages over other possible solutions and/or over the prior art, whether or not a particular advantage is achieved by a given embodiment is not limiting of the invention. Thus, the following aspects, features, embodiments and advantages are merely illustrative and are not considered elements or limitations of the appended claims except where explicitly recited in a claim(s). Likewise, reference to "the invention" shall not be construed as a generalization of any inventive subject matter disclosed herein and shall not be considered to be an element or limitation of the appended claims except where explicitly recited in a claim(s).

Figure 1:
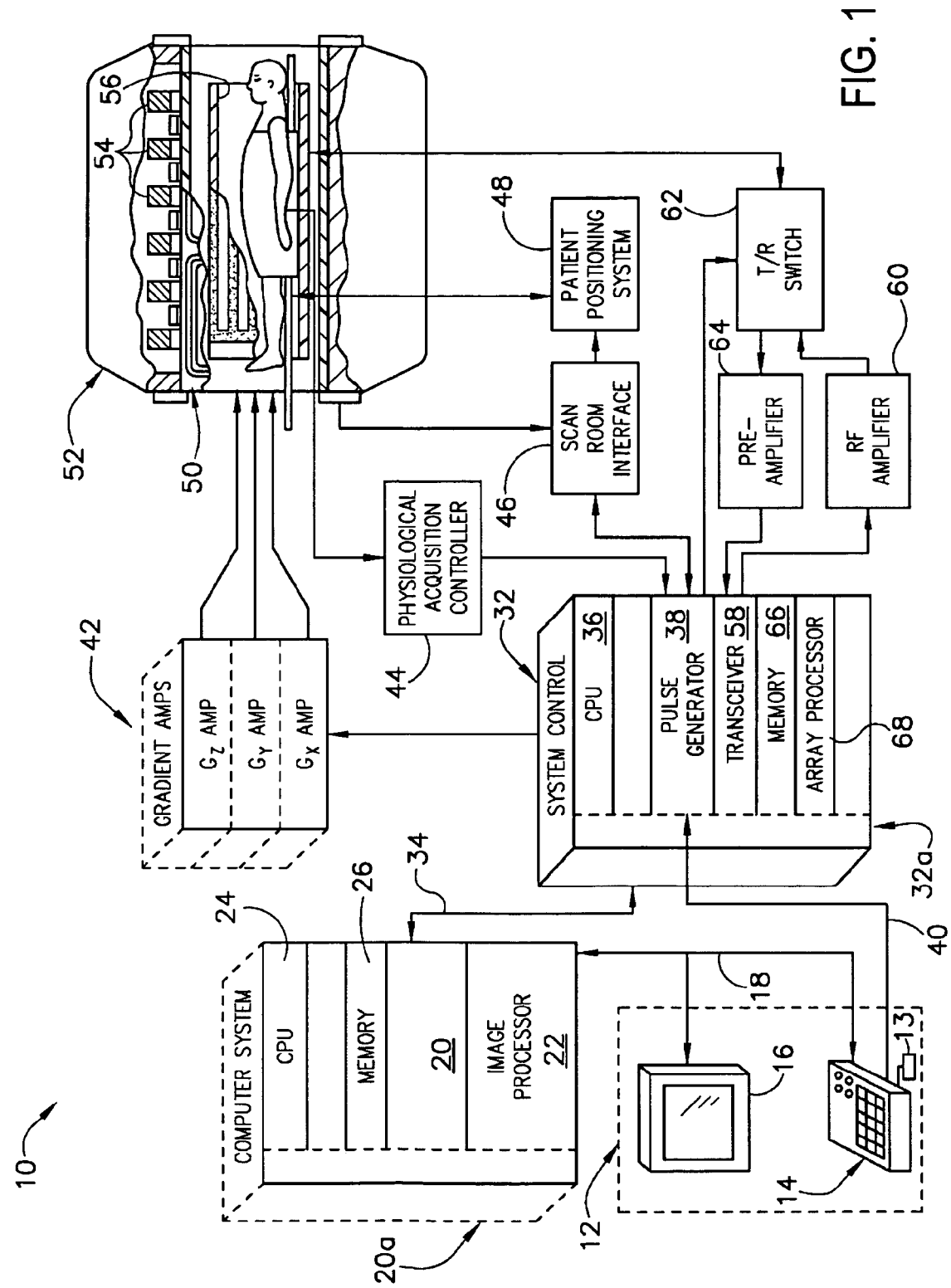
FIG. 1 is a schematic block diagram of an MR imaging system incorporating the present invention.

FIG. 1 shows the major components of an exemplary magnetic resonance imaging (MRI) system 10 incorporating embodiments of the invention. The operation of the system 10 is controlled from an operator console 12 which includes a keyboard or other input device 13, a control panel 14, and a display screen 16. The console 12 communicates through a link 18 with a separate computer system 20 that enables an operator to control the production and display of images on the display screen 16. The computer system 20 includes a number of modules which communicate with each other through a backplane 20a. These include an image processor module 22, a CPU module 24 and a memory module 26 that may include a frame buffer for storing image data arrays. The computer system 20 is linked to archival media devices, permanent or back up memory or a network for storage of image data and programs, and communicates with a separate system control 32 through a high speed serial link 34. The input device 13 can include a mouse, joystick, keyboard, track ball, touch activated screen, light wand, voice control, or any similar or equivalent input device, and may be used for interactive geometry prescription.

The system control 32 includes a set of modules connected together by a backplane 32a. These include a CPU module 36 and a pulse generator module 38 which connects to the operator console 12 through a serial link 40. It is through link 40 that the system control 32 receives commands from the operator to indicate the scan sequence that is to be performed. The pulse generator module 38 operates the system components to carry out the desired scan sequence and produces data which indicates the timing, strength and shape of the RF pulses produced, and the timing and length of the data acquisition window. The pulse generator module 38 connects to a set of gradient amplifiers 42, to indicate the timing and shape of the gradient pulses that are produced during the scan. The pulse generator module 38 can also receive patient data from a physiological acquisition controller 44 that receives signals from a number of different sensors connected to the patient, such as ECG signals from electrodes attached to the patient. And finally, the pulse generator module 38 connects to a scan room interface circuit 46 which receives signals from various sensors associated with the condition of the patient and the magnet system. It is also through the scan room interface circuit 46 that a patient positioning system 48 receives commands to move the patient to the desired position for the scan.

The gradient waveforms produced by the pulse generator module 38 are applied to the gradient amplifier system 42 having Gx, Gy, and Gz amplifiers. Each gradient amplifier excites a corresponding physical gradient coil in a gradient coil assembly generally designated 50 to produce the magnetic field gradients used for spatially encoding acquired signals. The gradient coil assembly 50 forms part of a magnet assembly 52 which includes a polarizing magnet 54 and a whole-body RF coil 56. A transceiver module 58 in the system control 32 produces pulses which are amplified by an RF amplifier 60 and coupled to the RF coil 56 by a transmit/receive switch 62. The resulting signals emitted by the excited nuclei in the patient may be sensed by the same RF coil 56 and coupled through the transmit/receive switch 62 to a preamplifier 64. The amplified MR signals are demodulated, filtered, and digitized in the receiver section of the transceiver 58. The transmit/receive switch 62 is controlled by a signal from the pulse generator module 38 to electrically connect the RF amplifier 60 to the coil 56 during the transmit mode and to connect the preamplifier 64 to the coil 56 during the receive mode. The transmit/receive switch 62 can also enable a separate RF coil (for example, a surface coil) to be used in either the transmit or receive mode.

The MR signals picked up by the RF coil 56 are digitized by the transceiver module 58 and transferred to a memory module 66 in the system control 32. A scan is complete when an array of raw k-space data has been acquired in the memory module 66. This raw k-space data is rearranged into separate k-space data arrays for each image to be reconstructed, and each of these is input to an array processor 68 which operates to Fourier transform the data into an array of image data. This image data is conveyed through the serial link 34 to the computer system 20 where it is stored in memory. In response to commands received from the operator console 12, this image data may be archived in long term storage or it may be further processed by the image processor 22 and conveyed to the operator console 12 and presented on the display 16.

In one embodiment of the invention, a method is provided for shortening 2D excitation pulses for MRI by use of under-sampling in 2D excitation space together with parallel imaging. An under-sampled echo-planar excitation trajectory is used to excite a column or "pencil" region. Because it is under-sampled, the duration of the pulse is drastically reduced at the cost of relatively closely-spaced replicates of the pencil region. This would normally result in ambiguous M-mode traces, where signals from the various pencil regions are combined together. If, however, an RF receiver array is positioned with multiple coils arrayed along the direction in which pencil replication is occurring (the excitation phase-encoding direction), then parallel imaging can be used to separate contributions from the various pencil regions.

Figure 2:
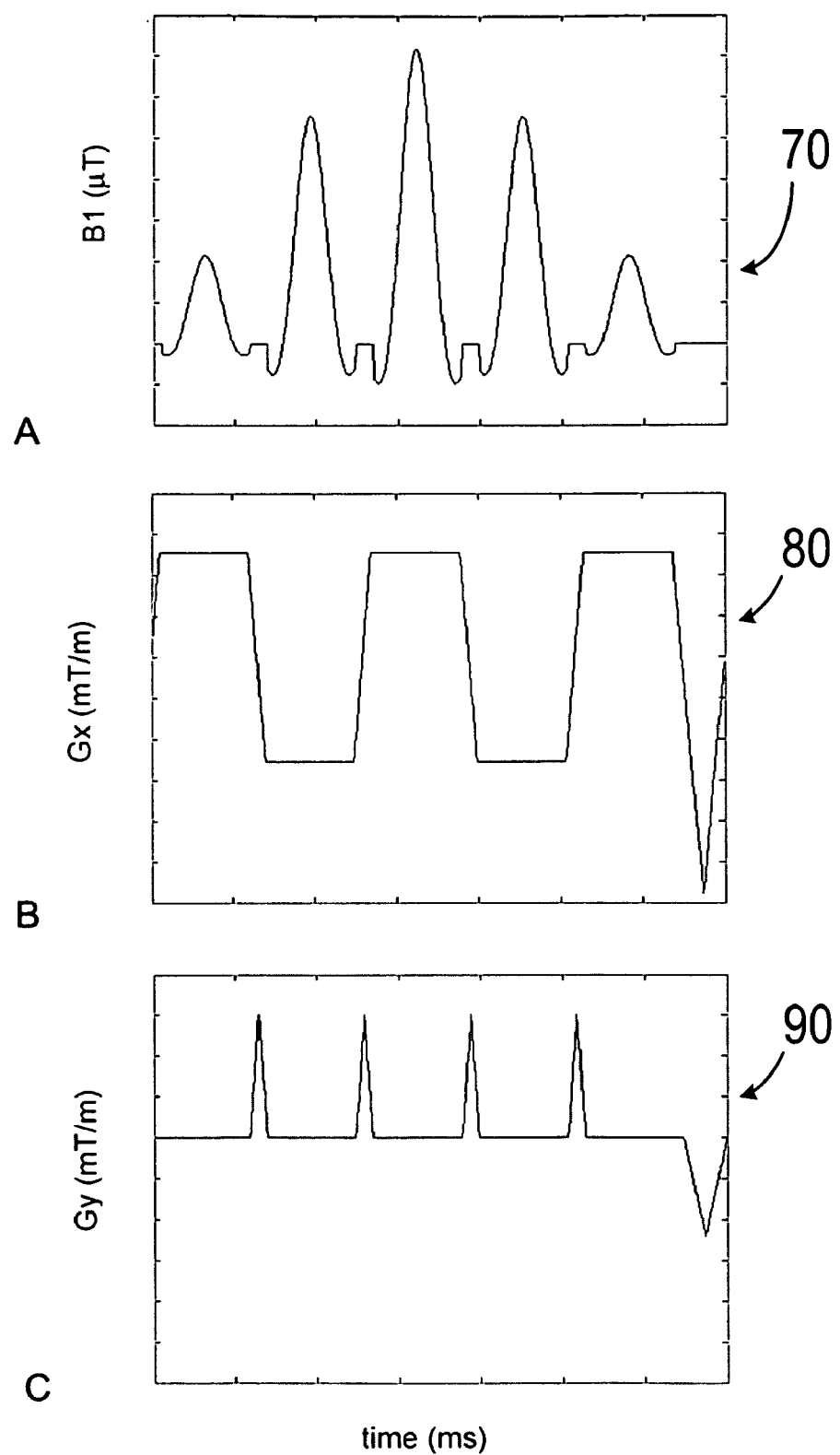
FIG. 2 shows an EPT (echo-planar-trajectory) 2D excitation pulse, according to one embodiment of the invention.
Figure 3:
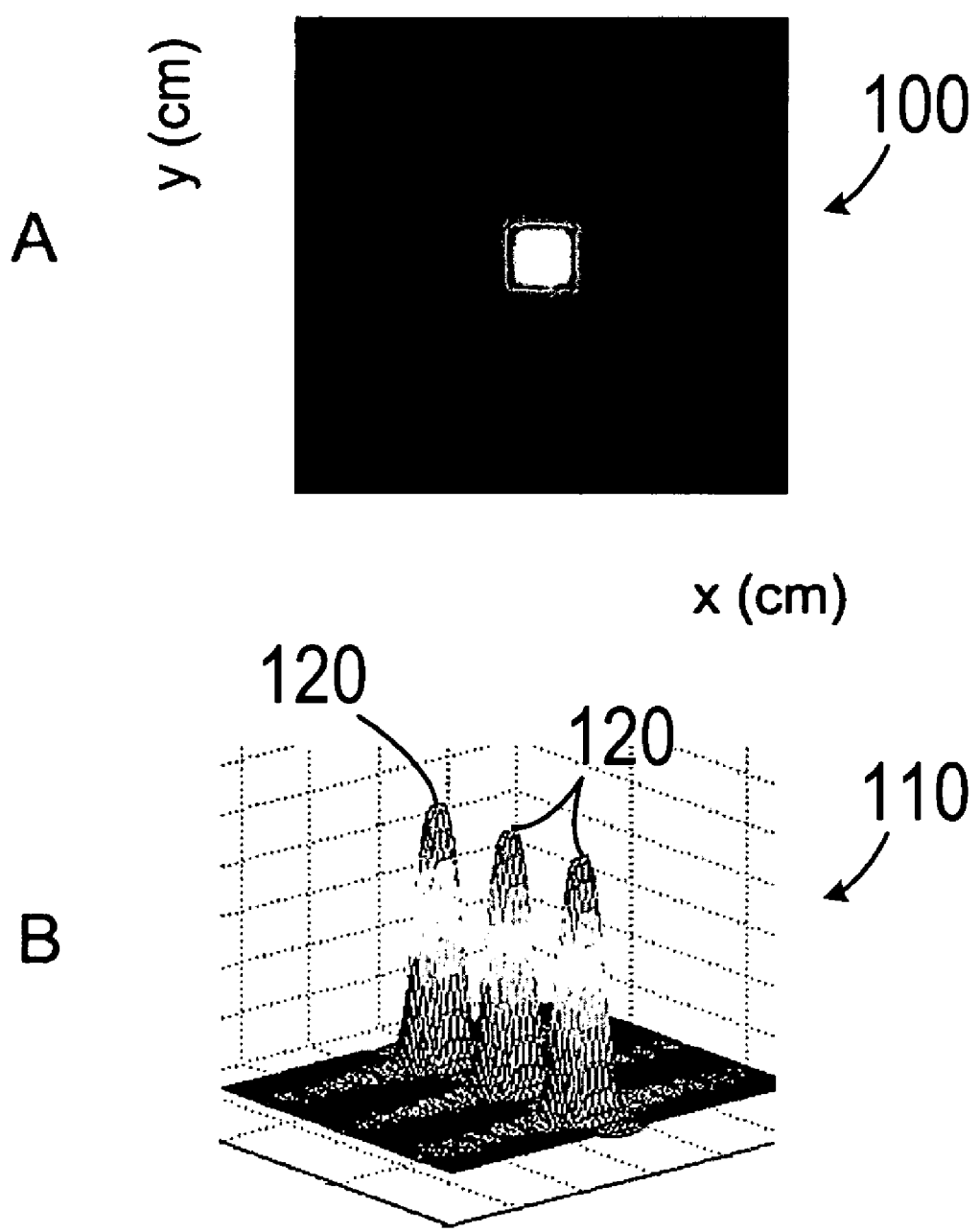
FIG. 3 shows target and actual excitation profiles of an EPT 2D excitation pulse, according to one embodiment of the invention.

FIG. 2 shows an EPT (echo-planar-trajectory) 2D excitation pulse according to one embodiment of the invention. A first pulse wave form 70 shows an RF waveform, a second pulse wave form 80 shows an excitation frequency-encode gradient waveform applied to the x-gradient axis, and a third pulse wave form 90 shows an excitation phase-encode gradient waveform applied to the y-gradient axis. The pulses of FIG. 2 can be produced by any conventional pulse generators and are all played out simultaneously. In an embodiment of the invention, the pulses of FIG. 2 are played out via pulse generator module 38 of FIG. 1, FIG. 3 shows profiles of the EPT 2D excitation pulse shown in FIG. 2 according to an embodiment of the present invention. A first profile 100 shows a 2D target profile, and second profile 110 shows an actual excitation profile, according to one embodiment of the invention, where the central 2D excitation region is replicated multiple times in the "excitation phase-encode" direction. The spins shown in second profile 110 are excited with a single RF transmit coil.

The gradient waveforms shown in FIG. 2 correspond to an under-sampled 5-line echo-planar excitation k-space trajectory. Their trajectory is used to excite a column or "pencil" region, and has been limited to 5 lines (yielding, e.g., 5 trapezoids in second pulse wave form 80) in order to reduce the duration of the 2D excitation pulse. This under-sampling results in relatively closely spaced replicates of the 2D excitation region in the excitation phase-encoding direction, as shown in the actual 2D excitation profile 110 of FIG. 3.

However, the invention is not limited to 5-line echo-planar excitation k-space trajectory. EPT trajectories with other line counts and line spacing may be used. For example, a 7-line echo-planar excitation k-space trajectory may be used instead.

The reduced number of k-space lines results in a relatively short (3.5 ms) pulse at the cost of closely spaced replicates of the target excitation region. For the purpose of simplification, only the center 3 replicates 120 are displayed in second profile 110 of FIG. 3. Imaging was performed on a 1.5 T Echospeed (33 mT/m, 120 T/m/s) Signa scanner.

According to one embodiment of the invention, the excitation pulse shown in FIG. 2 is used in a MR M-mode pulse sequence. The acquired signal contains combined contributions from the multiple replicates of the excitation region. This would normally result in ambiguous M-mode traces, where signals from the various pencil regions are combined together. However, to separate contributions from the various pencil regions caused by the under-sampled echo-planar excitation k-space trajectory, an RF receiver array is positioned with multiple coils arrayed along the direction where pencil replication is occurring (e.g., the excitation phase-encoding direction). Then parallel-imaging techniques such as SENSE (Sensitivity Encoding) can be employed to reconstruct an image by separating contributions from the various excitation regions.

Parallel imaging comprises two components—parallel imaging acquisition and parallel imaging reconstruction. In one embodiment of the invention, phase encoding is not used for image acquisition, which is different from classic parallel imaging acquisition. In classic parallel imaging acquisition, under-sampled phase encoding leads to ambiguous aliased images, which are "unfolded" into non-ambiguous images by the parallel imaging reconstruction. In one embodiment of the invention, the multiple pencil excitations, not under-sampled phase encoding, lead to ambiguous combined signals. These signals are again "unfolded" by the parallel imaging reconstruction. In one embodiment of the invention, parallel imaging reconstruction is identical to SENSE parallel imaging reconstruction.

Parallel imaging techniques such as SENSE form a valuable complement to gradient encoding. They permit considerable scan-time reduction with respect to standard Fourier imaging. The feasibility of parallel imaging has been demonstrated in vitro and in vivo. Any conventional image reconstructing means that can perform parallel imaging can be used. In an embodiment of the invention, an array processor 68 of FIG. 1 separates contributions from the multiple columns by use of parallel imaging reconstruction as described above.

Figure 4:
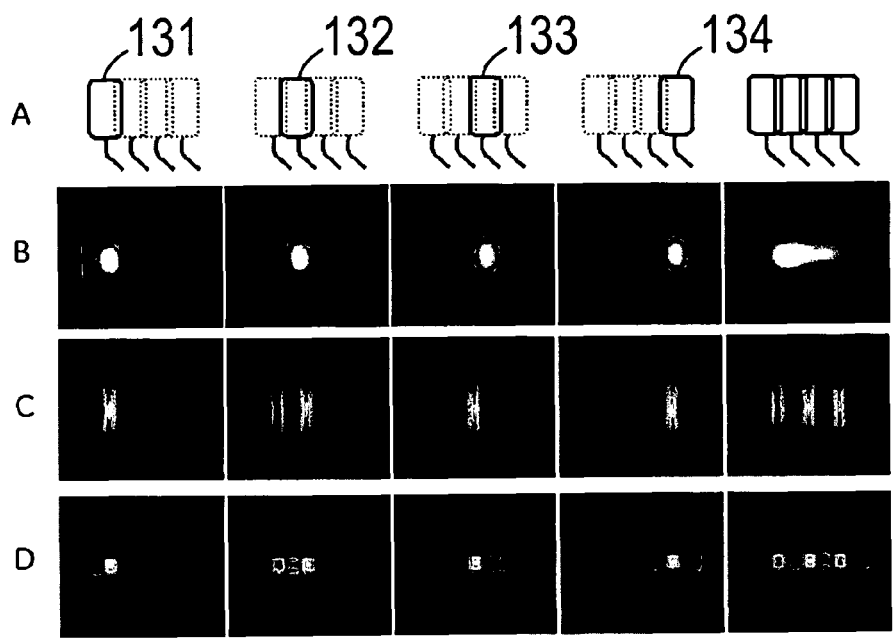
FIG. 4 shows MR images of a uniform phantom acquired without and with EPT 2D excitation according to one embodiment of the invention.

According to one embodiment of the invention, FIG. 4 shows an example where the under-sampled EPT excitation pulse of FIG. 2 is used to excite a region within a uniform phantom. FIG. 4 illustrates the excitation regions and the sensitivity patterns of the various coils in an example array.

Row A, for example, shows a linear 4-element receiver coil array with multiple coils 131, 132, 133 and 134, which are used for signal reception. According to one embodiment of the invention, the multiple coils 131, 132, 133 and 134 are arrayed along the direction where pencil replication is occurring. In one embodiment of the invention, the number of coils is at least equal to the number of pencil regions excited in the body. Row B shows coronal MR images of a uniform phantom acquired with the array using conventional slice selection. Rows C and D show coronal and axial MR images, respectively, of the phantom using the 2D excitation pulse of FIG. 2 according to one embodiment of the invention. The three inner replicates of the excitation pencil can be seen in a side view in row C and on-end in row D. Each column in FIG. 4 shows images acquired with the corresponding identified coil, with the rightmost column showing composite images from all coils. Because each coil of the array typically "lights up" the various members of the family of excitation pencils with different amplitudes and phases, the sensitivity maps of the coils can be used to unwrap contributions from different pencils, using any parallel imaging reconstruction method known in the art.

Figure 5:
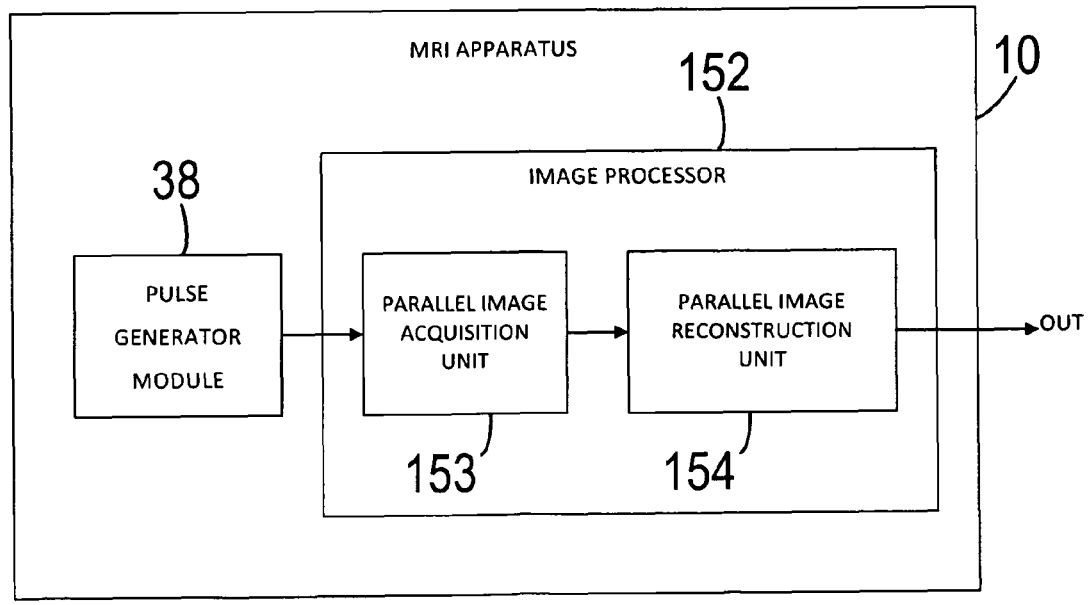
FIG. 5 shows a block diagram of a portion of the MRI apparatus of FIG. 1 according one embodiment of the invention.

FIG. 5 shows a block diagram of a portion of MRI system 10 shown in FIG. 1 according one embodiment of the invention. As shown in FIG. 5, the MRI system 10 comprises pulse generator module 38 for generating the multiple columns or pencil excitation regions by use of an under-sampled echo-planar excitation trajectory, and an image processor group 152 for separating contributions from the multiple columns or various pencil regions by use of parallel imaging reconstruction. The image processor group 152 comprises a parallel image acquisition unit 153 and a parallel image reconstruction unit 154 including array processor 68 (not shown) of MR system 10. The parallel image acquisition unit 153, for example, comprises the multiple coils 131, 132, 133 and 134 that are used for signal reception shown in FIG. 4. Because each coil of the array typically "lights up" the various members of the family of excitation pencils with different amplitudes and phases, the sensitivity maps of the coils can be used by the parallel imaging reconstruction unit 154 to unwrap contributions from different pencils, using any parallel imaging reconstruction method known in the art.

The method and apparatus of the invention simultaneously improve time resolution and provide M-mode traces from multiple regions. The invention therefore may provide improved performance for navigator echo applications, where the use of 2D excitation rather than spin-echo crossed slices will also reduce saturation effects, wherein the spin-echo crossed slices refer to two conventional slice selective pulses on orthogonal gradient axes—one the excitation pulse and the other the refocusing pulse. It should also aid M-mode and velocity-encoded M-mode MRI of the heart and great vessels. According to one embodiment of the invention, M-mode MRI is used to examine cardiac wall and/or valve motion from multiple regions in the heart. In another embodiment of the invention, velocity-encoded M-mode MRI is used to examine blood velocity components from multiple pencil regions simultaneously. In yet another embodiment of the invention, velocity-encoded M-mode MRI is used to examine cerebrospinal fluid velocity components from multiple pencil regions simultaneously.

While this technique would normally be used to remove contributions arising from outer replicates, leaving the central excitation region uncontaminated, it can also be used to remove wrapped signals that are contaminating the outer replicates. Thus, scrolling M-mode traces can be obtained from multiple regions simultaneously. For example, one application of this is respiratory navigation, where a pencil excitation placed across the diaphragm is used to monitor, gate, and correct respiratory motion. In this embodiment, respiratory motion could be monitored simultaneously across multiple regions of the diaphragm and heart.

In accordance with an embodiment of the invention, an MRI apparatus includes a magnetic resonance imaging (MRI) system having a plurality of gradient coils positioned about a bore of a magnet, and an RF transceiver system and an RF switch controlled by a pulse module to transmit RF signals to an RF coil assembly comprising at least one RF transmit coil and comprising multiple coils to acquire MR images. The MRI apparatus also has a computer programmed to excite multiple pencil regions by use of an under-sampled echo-planar excitation trajectory and acquire MR signals simultaneously on multiple channels of the multi-channel RF coil assembly. The computer is also programmed to separate contributions from the various multiple pencil regions by use of parallel imaging reconstruction.

In accordance with another embodiment of the invention, a method of producing an MR M-mode image of an object with an MRI apparatus includes executing an under-sampled echo-planar excitation trajectory to excite multiple columns of the object and acquiring MR signals simultaneously on multiple channels from an RF receiver array comprising multiple coils, each coil coupled to a respective channel. The method includes reconstructing an image from the acquired MR signals by separating contributions from the multiple columns by use of parallel imaging reconstruction.

In accordance with yet another embodiment of the invention, an MRI apparatus includes a pulse generator configured to generate multiple pencil excitation regions in an imaging subject by use of an under-sampled echo-planar excitation trajectory and an image processor. The image processor is configured to simultaneously acquire MR signals on multiple channels, the MR signals acquired from the multiple pencil excitation regions excited via the under-sampled echo-planar excitation trajectory. The image processor is also configured to separate contributions from the multiple pencil excitation regions on the simultaneously acquired MR signals by use of parallel imaging reconstruction.

While the invention has been described with reference to one or more embodiments of the invention, it will be understood by those skilled in the art that various changes may be made and equivalents may be substituted for elements thereof without departing from the scope of the invention. In addition, various modifications may be made to adapt a particular situation or material to the teachings of the invention without departing from the scope thereof. Therefore, it is intended that the invention not be limited to the particular embodiment disclosed as the best mode contemplated for carrying out this invention, but that the invention will include all embodiments falling within the scope of the appended claims.

What is claimed is:

1. An MRI apparatus comprising:
    a magnetic resonance imaging (MRI) system having a plurality of gradient coils positioned about a bore of a magnet, and an RF transceiver system and an RF switch controlled by a pulse module to transmit RF signals to an RF coil assembly comprising at least one RF transmit coil and comprising multiple coils to acquire MR images; and
    a computer usable medium having computer code therein, said computer code programmed to:
        excite multiple pencil regions by said RF signals using an under-sampled echo-planar excitation trajectory;
        acquire MR signals simultaneously on the multiple channels of the RF coil assembly;
        separate contributions to the MR signals from the various multiple pencil regions by use of parallel imaging reconstruction;
        acquire a sensitivity map for each of the multiple coils; and
        unwrap contributions from excited pencil regions on each of the multiple coils from respective sensitivity maps.

2. The method of claim 1 wherein the multiple coils of the RF coil assembly are arrayed along a direction in which pencil replication is occurring.

3. The method of claim 1 wherein the number of coils of the RF coil assembly is at least equal to the number of pencil regions excited in a region-of-interest.

4. The method of claim 1 wherein the computer, is being programmed to excite multiple pencil regions, is programmed to excite multiple pencil regions by use of a 5-line echo-planar excitation k-space trajectory.

5. The method of claim 1 wherein the computer, is being programmed to excite multiple pencil regions, is programmed to excite multiple pencil regions by use of a 7-line echo-planar excitation k-space trajectory.

6. The method of claim 1 wherein the computer is further programmed to perform the parallel imaging reconstruction by a SENSE (Sensitivity Encoding) reconstruction technique.

7. The method of claim 1 wherein an imaging mode of the MRI system is M-mode MRI.

8. The method of claim 7 wherein the imaging mode is velocity-encoded M-mode MRI.

9. A method of producing an MR M-mode image of an object with an MRI apparatus comprising:
    executing an under-sampled echo-planar excitation trajectory to excite multiple columns of the object;
    acquiring MR signals simultaneously on multiple channels from an RF receiver array comprising multiple coils, each coil coupled to a respective channel;
    reconstructing an image from the acquired MR signals by separating contributions from the multiple columns by use of parallel imaging reconstruction; and
    unwrapping contributions from different columns on each coil of the RF receiver array via a sensitivity map respective to each coil.

10. The method of claim 9 further comprising arraying the multiple coils along a direction in which column replication is occurring.

11. The method of claim 9 wherein the number of coils of the RF receiver array is at least equal to the number of columns excited in the object.

12. The method of claim 9 wherein executing comprises executing an under-sampled echo-planar excitation trajectory using a 5-line echo-planar excitation k-space trajectory.

13. The method of claim 9 wherein executing comprises executing an under-sampled echo-planar excitation trajectory using a 7-line echo-planar excitation k-space trajectory.

14. The method of claim 9 wherein reconstructing comprises reconstructing the image via a SENSE (Sensitivity Encoding) reconstruction technique.

15. An MRI apparatus comprising
    a pulse generator configured to generate multiple pencil excitation regions in an imaging subject by use of an under-sampled echo-planar excitation trajectory; and
    an image processor having computer code configured to:
        simultaneously acquire MR signals on multiple channels from an RF receiver array comprising multiple coils, the MR signals acquired from the multiple pencil excitation regions excited via the under-sampled echo-planar excitation trajectory; and separate contributions to the MR signals from the multiple pencil excitation regions on the simultaneously acquired MR signals by use of parallel imaging reconstruction acquire a sensitivity map for the multiple coils; and unwrap contributions from the excited pencil regions on the multiple coils from respective sensitivity maps.

16. The apparatus of claim 15 wherein each coil of the multiple coils is coupled to a respective channel.

17. The apparatus of claim 15 wherein a direction of the RF receiver array is configured to lie along a direction of pencil replication.

18. The apparatus of claim 15 wherein the under-sampled echo-planar excitation trajectory comprises no more than seven lines.

* * * * *